United States Patent
Toyama et al.

(10) Patent No.: US 9,349,506 B2
(45) Date of Patent: May 24, 2016

(54) SHIELD MEMBER, WIRE HARNESS, AND METHOD OF MANUFACTURING WIRE HARNESS

(75) Inventors: Eiichi Toyama, Kosai (JP); Shigemi Hashizawa, Kosai (JP)

(73) Assignee: YAZAKI CORPORATION, Tokyo (JP)

( * ) Notice: Subject to any disclaimer, the term of this patent is extended or adjusted under 35 U.S.C. 154(b) by 100 days.

(21) Appl. No.: 13/810,739

(22) PCT Filed: Jul. 14, 2011

(86) PCT No.: PCT/JP2011/066111
§ 371 (c)(1),
(2), (4) Date: Jan. 17, 2013

(87) PCT Pub. No.: WO2012/011431
PCT Pub. Date: Jan. 26, 2012

(65) Prior Publication Data
US 2013/0112473 A1    May 9, 2013

(30) Foreign Application Priority Data
Jul. 21, 2010 (JP) ................................ 2010-163482

(51) Int. Cl.
| H01B 11/06 | (2006.01) |
| H01B 9/02 | (2006.01) |
| B60R 16/02 | (2006.01) |
| H01B 13/012 | (2006.01) |
| H05K 9/00 | (2006.01) |

(52) U.S. Cl.
CPC .............. *H01B 9/02* (2013.01); *B60R 16/0215* (2013.01); *H01B 13/012* (2013.01); *H05K 9/00* (2013.01); *H05K 9/0098* (2013.01); *Y10T 29/49117* (2015.01)

(58) Field of Classification Search
CPC ................................ H01B 7/0861; H02G 3/04
USPC ..................................... 174/36, 72 A
See application file for complete search history.

(56) References Cited

U.S. PATENT DOCUMENTS 2,769,148 A * 10/1956 Clogston ........................ 333/236
3,329,547 A *  7/1967 Denenberg ..................... 156/247
(Continued)

FOREIGN PATENT DOCUMENTS

| CN | 101840750 A | 9/2010 |
| JP | 1-089422 U | 6/1989 |

(Continued)

OTHER PUBLICATIONS

International Search Report (PCT/ISA/210) dated Aug. 16, 2011 issued by the International Searching Authority in counterpart International Application No. PCT/JP2011/066111.
(Continued)

*Primary Examiner* — Chau N Nguyen
(74) *Attorney, Agent, or Firm* — Sughrue Mion, PLLC

(57) ABSTRACT

A shield member includes a metal foil layer and a base layer which have flexibility and are sheet-like or band-like, a bonding layer which bonds the metal foil layer and the base layer, and a cylindrical portion and an overlapping portion which are made by winding and folding the metal foil layer and the base layer so that the metal foil layer is on an inside. The overlapping portion is in a state of being brought down and arranged along the cylindrical portion.

6 Claims, 2 Drawing Sheets

(56) References Cited

U.S. PATENT DOCUMENTS

| | | | | |
|---|---|---|---|---|
| 4,749,625 | A | * | 6/1988 | Obayashi et al. ............. 428/624 |
| 4,920,235 | A | | 4/1990 | Yamaguchi |
| 5,023,395 | A | * | 6/1991 | O'Connor ....................... 174/36 |
| 5,573,857 | A | * | 11/1996 | Auger ........................... 428/480 |
| 5,956,445 | A | * | 9/1999 | Deitz et al. ................... 385/100 |
| 6,166,326 | A | * | 12/2000 | Nakajima ....................... 174/36 |
| 6,635,825 | B2 | * | 10/2003 | Adachi ............... H02G 3/0481 174/135 |
| 8,525,029 | B2 | * | 9/2013 | Kato .................. B60R 16/0215 174/113 R |
| 2003/0119351 | A1 | | 6/2003 | Miyazaki et al. |
| 2009/0311456 | A1 | | 12/2009 | Harris |
| 2010/0236827 | A1 | | 9/2010 | Doi et al. |
| 2011/0011639 | A1 | * | 1/2011 | Visser ........................... 174/350 |

FOREIGN PATENT DOCUMENTS

| | | | |
|---|---|---|---|
| JP | 10-173385 | A | 6/1998 |
| JP | 10173385 | A | 6/1998 |
| JP | 10-284871 | A | 10/1998 |
| JP | 10284871 | A | 10/1998 |
| JP | 2000-77881 | A | 3/2000 |
| JP | 200077881 | A | 3/2000 |
| JP | 2002271082 | A | 9/2002 |
| JP | 2003197037 | A | 7/2003 |
| JP | 2007-265747 | A | 10/2007 |
| JP | 2007-266082 | A | 10/2007 |
| JP | 200993934 | A | 4/2009 |

OTHER PUBLICATIONS

Written Opinion (PCT/ISA/237) dated Aug. 16, 2011 of the International Searching Authority in counterpart International Application No. PCT/JP2011/066111.

Communication issued on Apr. 1, 2015 by the State Intellectual Property Office of the PR of China in related Application No. 201180035728.2.

Office Action dated Nov. 18, 2014 issued by the Japanese Patent Office in counterpart Japanese Patent Application No. 2010-163482.

Office Action dated Nov. 3, 2015, issued by the State Intellectual Property Office of the People's Republic of China in counterpart Chinese Application No. 201180035728.2.

Office Action, dated May 20, 2014, issued by the Japanese Patent Office in counterpart Japanese Application No. 2010-163482.

Extended European Search Report, dated Jul. 9, 2014, issued by the European Patent Office in counterpart European Application No. 11809602.3.

* cited by examiner

SHIELD MEMBER, WIRE HARNESS, AND METHOD OF MANUFACTURING WIRE HARNESS

TECHNICAL FIELD

The present invention relates to a shield member, a wire harness including the shield member, and a method of manufacturing the wire harness.

BACKGROUND ART

Hitherto, an inverter and a battery mounted in, for example, a hybrid vehicle or an electric vehicle are electrically connected by a thick electric wire for a high voltage, which has a conductor with a large cross-sectional area. In addition, in order to prevent peripheral devices from malfunctioning due to noise radiated from the thick electric wire, the periphery of the thick electric wire is covered with a braided shield member (for example, refer to Patent Literature 1 below). In addition, without being limited to the braided shield member, a shield member made by using a metal foil (refer to Patent Literature 2 below) may also be applied.

CITATION LIST

Patent Literature

[Patent Literature 1] JP-A-2003-197037
[Patent Literature 2] JP-A-2009-93934

SUMMARY OF INVENTION

Technical Problem

The braided shield member according to the related art is generally used for electromagnetic shielding. However, the number of element wires that constitute the braids reaches for example, 300, there is a problem in that a relatively heavy member is made. If a reduction in weight is considered, it is known that the size of the mesh of the braids is increased, and as a result, there is concern about not obtaining a favorable shield effect. Therefore, it can be said that there is a limit to achieving a reduction in weight while ensuring an electromagnetic shield effect.

Here, the inventors of the present application have considered using a metal foil shield member as a replacement for the braided shield member. However, the metal foil shield member has the following problems. That is, in the metal foil shield member disclosed in Patent Literature 2, a sheet-like member (conductor sheet) is wound and folded, and an overlapping portion is formed here. The overlapping portion extends in the longitudinal direction of the electric wire in a protruding state and in a relatively stiff state, and thus there is a problem in that the overlapping portion is not bendable in any direction. In a wire harness that includes the metal foil shield member in its configuration, there is a problem in that the bending direction is restricted.

The present invention has been made taking the foregoing circumstances into consideration, and an object thereof is to provide a shield member which achieves a reduction in weight while ensuring an electromagnetic shield effect and moreover is bendable in any direction, a wire harness including the shield member, and a manufacturing method thereof.

Solution to Problem

The object of the present invention is accomplished by the following configurations.

(1) A shield member includes: a metal foil layer and a base layer which have flexibility and are sheet-like or band-like; a bonding layer which bonds the metal foil layer and the base layer; and a cylindrical portion and an overlapping portion which are made by winding and folding the metal foil layer and the base layer so that the metal foil layer is on an inside, wherein the overlapping portion is in a state of being brought down and arranged along the cylindrical portion.

(2) The shield member of the configuration of (1), further includes a holding member which holds the overlapping portion in the state of being brought down and arranged along the cylindrical portion.

(3) A wire harness includes: the shield member of the configuration of (1) or (2); and one or a plurality of conductive paths that are accommodated in the cylindrical portion of the shield member.

(4) The wire harness of the configuration of (3), wherein an exterior member provided at an outside of the shield member is included, or the base layer of the shield member also functions as the exterior member.

(5) A method of manufacturing a wire harness includes: winding and folding a sheet-like member or a band-like member which is flexible and includes a metal foil layer, a base layer, and a bonding layer that bonds the metal foil layer and the base layer around a single or a plurality of conductive paths so that the metal foil layer is on an inside; and among a cylindrical portion and an overlapping portion which are made by the winding and folding, bringing down the overlapping portion so as to be arranged along the cylindrical portion.

According to the shield member of the configuration of (1), since the metal foil is used for shielding, an effect of achieving a reduction in weight while exhibiting an electromagnetic shield effect compared to a case of using braids (while sufficiently ensuring the electromagnetic shield effect) is exhibited. In addition, the overlapping portion formed by the winding and folding is not in a protruding state but the overlapping portion is in the state of being brought down and being arrange along the cylindrical portion. Therefore, a part that disrupts a bend does not protrude unlike in the example according to the related art, so that an effect of allowing a bend in any direction is exhibited. In addition, an effect of easily performing an electrical connection between end portions of the metal foil is exhibited.

According to the shield member of the configuration of (2), since the overlapping portion is held in the state of being arranged along the cylindrical portion by the holding member, an effect of stabilizing the bendable state even in any direction is exhibited.

According to the wire harness of the configuration of (3), an effect of achieving a reduction in weight while ensuring the electromagnetic shield effect and moreover providing the wire harness which is bendable in any direction is exhibited.

According to the wire harness of the configuration of (4), an effect of providing the exterior member depending on the form of usage or causing the base layer of the shield member to function as the exterior member is exhibited.

According to the method of manufacturing a wire harness of the configuration of (5), an effect of providing the method of manufacturing the wire harness which achieves a reduction in weight while ensuring the electromagnetic shield effect and moreover is bendable in any direction is exhibited.

BRIEF DESCRIPTION OF DRAWINGS

FIG. 1(a) is a schematic diagram of a vehicle, FIG. 1(b) is a configuration diagram of the wire harness, FIG. 1(c) is a configuration diagram of the shield member, and FIG. 1(d) is an explanatory view illustrating the shield member.

FIG. 2(a) is a schematic diagram of a first step, FIG. 2(b) is a schematic diagram of a second step, FIG. 2(c) is a schematic diagram of a third step, and FIG. 2(d) is a schematic diagram of a fourth step.

DESCRIPTION OF EMBODIMENTS

Hereinafter, an embodiment will be described with reference to the drawings.

A wire harness of this embodiment is intended to be installed in a hybrid vehicle or an electric vehicle. The wire harness includes a shield member of this embodiment. Hereinafter, the wire harness in the hybrid vehicle is exemplified and described (even in the case of the electric vehicle, basically the same configurations, structures, and effects of the wire harness and the shield member of this embodiment are applied, and, this embodiment may also be applied to a typical vehicle or the like without being limited to the hybrid vehicle or the electric vehicle).

Figure 1:
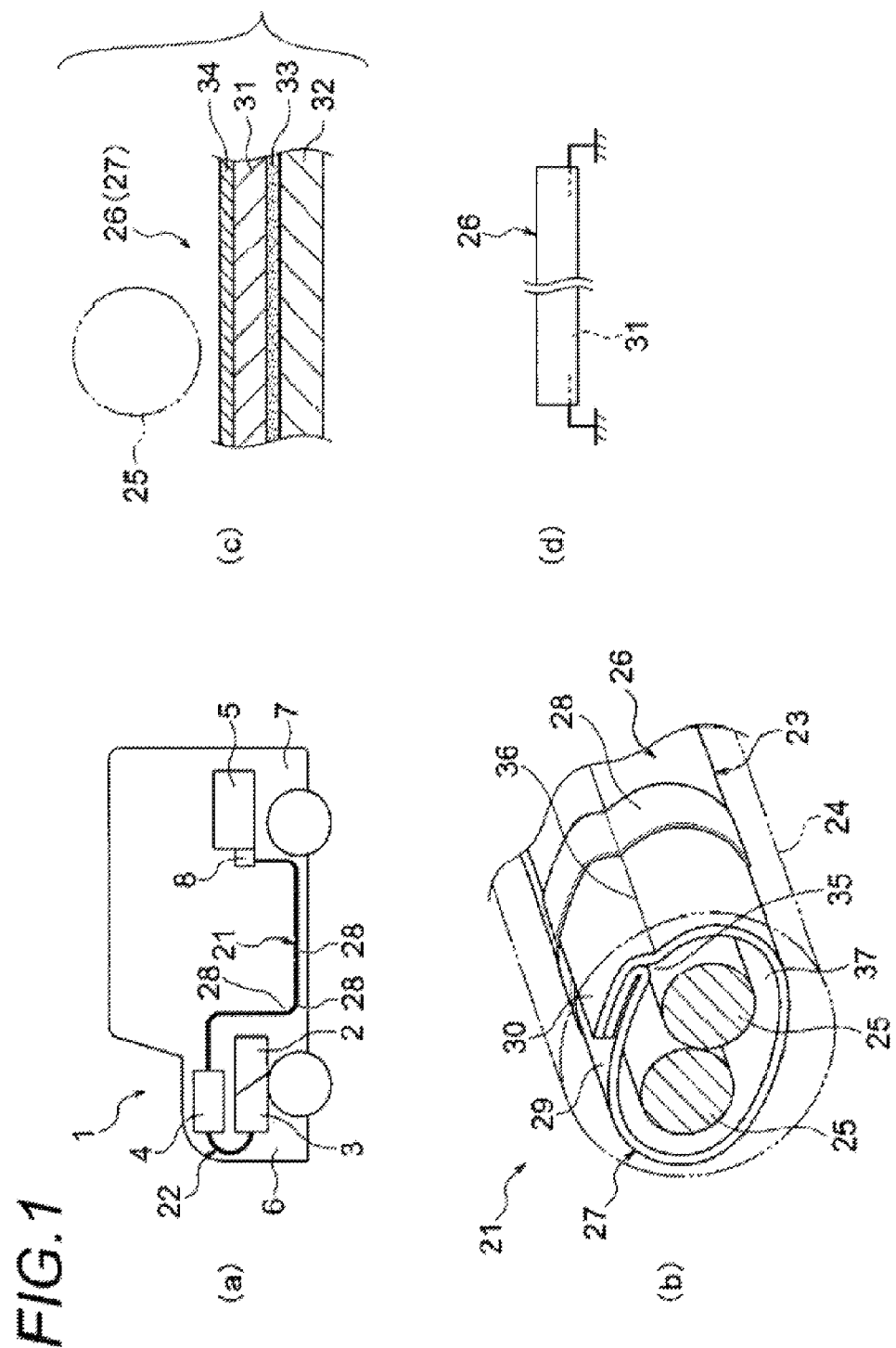
FIGS. 1(a) to 1(d) are diagrams illustrating a shield member and a wire harness according to an embodiment of the present invention, where

In FIG. 1(a), reference numeral 1 denotes a hybrid vehicle. The hybrid vehicle 1 is a vehicle that is driven by mixing two types of power of an engine 2 and a motor unit 3, and power is supplied to the motor unit 3 from a battery 5 (battery pack) via an inverter unit 4. The engine 2, the motor unit 3, and the inverter unit 4 are mounted in an engine room 6 at a position where front wheels and the like are present in this embodiment. In addition, the battery 5 is mounted in a vehicle rear portion 7 where rear wheels and the like are present (may also be mounted in a vehicle interior that is present at the rear of the engine room 6).

The battery 5 and the inverter unit 4 are connected by a high-voltage wire harness 21 according to this embodiment. In addition, the motor unit 3 and the inverter unit 4 are also connected by a high-voltage wire harness 22 according to this embodiment. Wiring of the wire harness 21 may be achieved either on the ground side of a floor panel under the floor and on the interior side on the floor. The wire harness 21 is manufactured to be long. On the other hand, the wire harness 22 is a so-called motor cable and is manufactured to be significantly shorter compared to the wire harness 21.

In this embodiment, the present invention is applied to each of the wire harnesses 21 and 22. In addition, naturally, the present invention may be applied to only the wire harness 21, or only the wire harness 22.

Here, in a supplementary explanation of this embodiment, the motor unit 3 includes a motor and a generator in its configuration. In addition, the inverter unit 4 includes an inverter and a converter in its configuration. The motor unit 3 is formed as a motor assembly including a shield case. In addition, the inverter unit 4 is also formed as an inverter assembly including a shield case. The battery 5 is Ni-MH-based or Li-ion-based, and is modularized. In addition, it is possible to use an electricity storage unit such as a capacitor. The battery 5 is not particularly limited as long as it is possible to be used in the hybrid vehicle 1 or the electric vehicle. The battery 5 and the wire harness 21 are connected via a junction block 8 in this embodiment.

As illustrated in FIG. 1(b), the wire harness 21 that connects the battery 5 and the inverter unit 4 includes a wire harness body 23, connection portions (not shown) provided at both ends of the wire harness body 23 respectively, and an exterior member 24 that protects the wire harness body 23. In addition, the exterior member 24 is arbitrarily set (it is needless to say that in the case where the wire harness 21 is wired under the floor, the exterior member 24 is useful).

The wire harness 22 that connects the motor unit 3 and the inverter unit 4 includes a wire harness body and connection portions provided at both ends of the wire harness body respectively. The wire harness body in the wire harness 22 of this embodiment has basically the same configuration as that of the wire harness body 23 of the wire harness 21 (the number (3) of high-voltage electric wires 25 described later is different). In addition, the connection portions in the wire harness 22 have basically the same configuration as that of the connection portions (not shown) of the wire harness 21.

First, the configuration of the wire harness 21 as a representative example will now be described.

As illustrated in FIG. 1(b), the wire harness body 23 includes two high-voltage electric wires 25 (conductive paths) and a shield member 26 that collectively accommodates the two high-voltage electric wires 25. Although described later, the wire harness body 23 is characterized in the shield member 26 and is bendable in any direction.

The high-voltage electric wire 25 is a conductive path that includes a conductor and an insulator (cover) and is formed to have a length needed for an electrical connection. The conductor is manufactured of copper, a copper alloy, or aluminum in this embodiment. The conductor may have any of a conductor structure made by twisting element wires and a bar-shaped conductor structure having a rectangular or round cross-section (for example, a conductor structure having a straight angle single core or a round single core, and in this case, the electric wire itself has a bar shape). The high-voltage electric wire 25 has the configuration of a non-shielded electric wire. In addition, in this embodiment, the high-voltage electric wires 25 are used, and this embodiment is not limited thereto. That is, a busbar may also be used, and in a case of a typical vehicle or the like, a low-voltage electric wire bundle may also be used.

The shield member 26 includes a sheet-like member 27 having flexibility and a holding member 28 used after winding and folding the sheet-like member 27. When the sheet-like member 27 is wound and folded around the two high-voltage electric wires 25 from the sheet-like state, the sheet-like member 27 has a cylindrical portion 29 as in a state of surrounding the two high-voltage electric wires 25 and an overlapping portion 30 made by overlapping both end sides in the width direction of the sheet-like member 27, thereby being formed in the illustrated shape. The overall length of the shield member 26 is set depending on the range in which an electromagnetic shield function is exhibited.

As illustrated in FIG. 1(c), the sheet-like member 27 includes a metal foil layer 31 and a base layer 32 which are sheet-like, a bonding layer 33 that bonds these layers, and a plated layer 34. In this configuration, in order from the closest side to the high-voltage electric wires 25, in other words, in order from the side which becomes the innermost layer during winding and folding, the plated layer 34, the metal foil layer 31, the bonding layer 33, and the base layer 32 are lined up.

In this embodiment, the plated layer 34 is a layer having a predetermined thickness (for example, about 0.8 μm) made by tinning, which is performed on the metal foil layer 31 for the purpose of ensuring environmental resistance (for the purpose of a rustproofing treatment). In addition, there is no limitation to the tinning as long as conductivity is provided, and the plated layer 34 is arbitrarily set. In this embodiment, the metal foil layer 31 made of a copper foil is used, and thus tinning is performed considering the environment.

The metal foil layer 31 is a layer having a predetermined thickness (for example, about 35 μm) made of a metal foil having conductivity, such as copper, a copper alloy, aluminum, an aluminum alloy, or iron and is provided as a part that exhibits the electromagnetic shield function. The metal foil layer 31 is connected to the shield case of the inverter unit 4 or a junction block 8 via the connection portions (not shown), thereby achieving frame ground (see FIG. 1(d)).

The bonding layer 33 is a layer for bonding the metal foil layer 31 and the base layer 32 so as not to be peeled off, and in this embodiment, a well-known adhesive is used although not being particularly limited.

The base layer 32 is a layer having a predetermined thickness (for example, about 25 μm) which is the base of the sheet-like member 27, and in this embodiment, is formed to have the same size as that of the metal foil layer 31 (which is an example). The material of the base layer 32 may be appropriately selected depending on the form of usage of the wire harness body 23, and for example, a PET sheet made of polyethylene terephthalate, a polyester sheet, acetate cloth, polyester cloth, glass cloth, insulating paper, PET woven fabric, and polyester cloth are employed as appropriate examples.

The base layer 32 is selected in consideration of "tension", "rubbing", "tearing", "vibration", "cost", and the like.

Although seen from the below description, the holding member 28 is used to hold the overlapping portion 30 in a state of being brought down and arranged along the cylindrical portion 29, and holding by tape fastening (tape winding), holding by clamping, tightening by a binding band, holding by an insertion into a cylindrical member (a corrugated tube, a spiral tube, a bendable pipe, or the like), and the like may be employed. In addition, it can be said that the tape fastening realizes the simplest method of holding.

The cylindrical portion 29 in the shield member 26 is formed in a cylindrical shape that surrounds the two high-voltage electric wires 25. In addition, the cylindrical portion 29 is formed by being "loosely-fitted" to the two high-voltage electric wires 25 (with a sufficient gap 37) (which is an example). The cylindrical portion 29 is formed so that the metal foil layer 31 (in this embodiment, the plated layer 34 is the innermost layer) is on the inside and the base layer 32 is the outermost layer during winding and folding. In the cylindrical portion 29, the metal foil layer 31 (in this embodiment, the plated layer 34) forms a closed circuit in the circumferential direction over the overlapping portion 30 from a part of a joint 35.

On the other hand, the overlapping portion 30 in the shield member 26 is formed by overlapping both end sides in the width direction of the sheet-like member 27. In addition, a base end portion 36 of the overlapping portion 30 is formed to be positioned at the joint 35 of the cylindrical portion 29. The overlapping portion 30 falls down to one side so as to fold the base end portion 36, and is held in a state of being arranged along the cylindrical portion 29.

In this embodiment, the overlapping portion 30 is subjected to fixing to connect the metal foil layers 31 (in this embodiment, the plated layers 34) with an adhesive, a double-side tape, or the like having conductivity. In addition, the protruding length of the overlapping portion 30 is arbitrary and is appropriately set considering the aspects of cost and functions (is set to about 10 mm in this embodiment also depending on the size of the wire harness 21). It is preferable that the overlapping portion 30 do not generate an opening at the overlap point, for example, when the wire harness body 23 is bent.

The exterior member 24 is a member for protecting the wire harness body 23 in the wire harness 21, and may employ a corrugated tube, a pipe member, a protector, and the like which are well-known. The exterior member 24 is provided outside the shield member 26. In addition, when the base layer 32 of the shield member 26 functions as the exterior member, setting of the exterior member 24 is unnecessary (it is preferable that the wire harness 21 use the exterior member 24 at least in a part under the floor).

Next, a method of manufacturing the wire harness 21, particularly, a method of manufacturing a part of the wire harness body 23 will now be described on the basis of the above-described configurations and structures.

Figure 2:
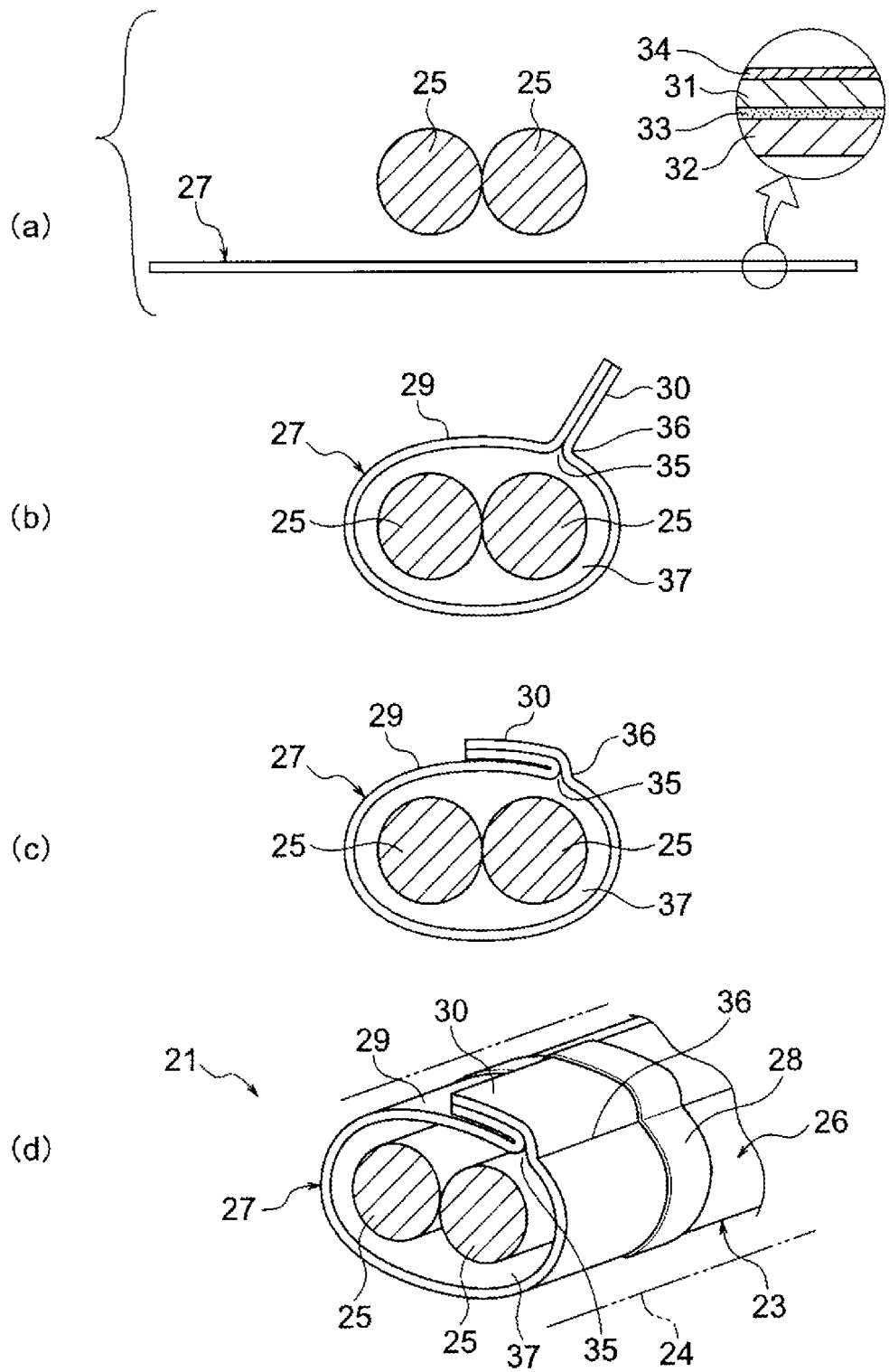
FIGS. 2(a) to 2(d) are diagrams illustrating a method of manufacturing a wire harness according to the embodiment of the present invention, where

In FIG. 2(a), in a first step, an operation of preparing the high-voltage electric wires 25 and the sheet-like member 27 is performed. Here, the sheet-like member 27 is disposed so that the metal foil layer 31 is closer to the high-voltage electric wires 25 side than the base layer 32.

In FIG. 2(b), in a second step, an operation of winding and folding the sheet-like member 27 in a form that rolls up the high-voltage electric wires 25 so as to form the cylindrical portion 29 and the overlapping portion 30 is performed. Here, the cylindrical portion 29 is formed to have a sufficient gap 37 from the two high-voltage electric wires 25. In addition, the overlapping portion 30 is formed to electrically connect the metal foil layers 31.

In FIG. 2(c), in a third step, an operation of bringing down the overlapping portion 30 to one side so as to fold the base end portion 36 of the overlapping portion 30 and cause the brought-down overlapping portion 30 to follow the cylindrical portion 29 is performed.

In FIG. 2(d), in a fourth step, an operation of providing the holding member 28 at an appropriate position to hold the overlapping portion 30 in the state of being arranged along the cylindrical portion 29 is performed. Here, in the case where the holding member 28 employs tape fastening, the interval of fastening is reduced at a position corresponding to the bend point of the wire harness 21, and accordingly the opening of the overlapping portion 30 is restricted, which is an appropriate example.

As described above with reference to FIGS. 1(a) to 2(d), according to this embodiment, since the metal foil layers 31 are electrically connected to each other in the overlapping portion 30, the cylindrical electromagnetic shield structure is formed, and thus an effect of ensuring favorable performance is exhibited.

In addition, according to this embodiment, since the overlap portion 30 is brought down to one side so as to fold the base end portion 36 of the overlapping portion 30 and the brought-down overlapping portion 30 is in the state of being arranged along the cylindrical portion 29, an effect of providing the shield member 26 and the wire harness body 23 which are bendable in any direction is exhibited.

In addition, according to this embodiment, since the configuration and structure of the shield member 26 are as described above, an effect of achieving the electromagnetic shield effect even with a bend in any direction is exhibited.

In addition, according to this embodiment, since the cylindrical portion 29 is formed to have the sufficient gap 37 from the high-voltage electric wires 25 when the sheet-like member 27 included in the shield member 26 is wound and folded, an effect of reducing damage due to a bend (for example, damage from the high-voltage electric wires 25 and the like) by the gap 37 even when the wire harness body 23 is thereafter bent is exhibited.

In addition, according to this embodiment, since the part that exhibits the electromagnetic shield function is the shield member 26 including the metal foil layer 31, an effect of reducing mass by about 1/10 compared to the braided shield member as in the related art is exhibited. That is, an effect of achieving a reduction in weight is exhibited.

In addition, according to this embodiment, since the wire harness 21 is manufactured by a simple step of winding the sheet-like member 27 included in the shield member 26 around the high-voltage electric wires 25, an effect of reducing manufacturing cost is exhibited.

While the shield member, the wire harness, and the method of manufacturing the wire harness of the present invention have been described in detail or with reference to the particular embodiments, as a matter of course, various modifications of the above-described embodiments may be made in a range that does not change the gist of the present invention.

In the above description, the shield member 26 is configured to have the metal foil layer 31 via the bonding layer 33 on one surface of the base layer 32. However, the following configuration may also be employed without a limitation thereto. That is, the one surface side of the base layer 32 is the same, and the other surface thereof may be provided with the same base layer as the base layer 32 on the same bonding layer as the bonding layer 33. That is, a configuration in which two base layers 32 are overlapped may be employed (for example, two sheets of PET woven fabric are overlapped). The shield member in this case has the electromagnetic shield function and the function of the exterior member.

In addition, regarding the function of the exterior member, in the case where the holding member 28 employs tape fastening, the holding member 28 may also function as the exterior member when a half lap is made using PET woven fabric as the material of the tape fastening.

This application is based on Japanese Patent Application (Japanese Patent Application No. 2010-163482), filed on Jul. 21, 2010, the content of which is incorporated herein by reference.

INDUSTRIAL APPLICABILITY

According to the present invention, the shield member is made using the metal foil, and the shield member in which the overlapping portion formed by winding and folding is not in a protruding state and the overlapping portion is in the state of being brought down and arranged along the cylindrical portion is achieved. The wire harness includes the shield member in its configuration and is manufactured using the shield member. According to the present invention, the holding member is included in the configuration of the shield member, and the overlapping portion is held in the state of being arranged along the cylindrical portion and being brought down by the holding member.

REFERENCE SIGNS LIST

1 HYBRID VEHICLE
2 ENGINE
3 MOTOR UNIT
4 INVERTER UNIT
5 BATTERY
6 ENGINE ROOM
7 VEHICLE REAR PORTION
8 JUNCTION BLOCK
21, 22 WIRE HARNESS
23 WIRE HARNESS BODY
24 EXTERIOR MEMBER
25 HIGH-VOLTAGE ELECTRIC WIRE (CONDUCTIVE PATH)
26 SHIELD MEMBER
27 SHEET-LIKE MEMBER
28 HOLDING MEMBER
29 CYLINDRICAL PORTION
30 OVERLAPPING PORTION
31 METAL FOIL LAYER
32 BASE LAYER
33 BONDING LAYER
34 PLATED LAYER
35 JOINT
36 BASE END PORTION
37 GAP

The invention claimed is:

1. A shield member comprising:
a metal foil layer and a base layer which have flexibility and are sheet-like or band-like;
a bonding layer which bonds the metal foil layer and the base layer;
a cylindrical portion and an overlapping portion which are made by winding and folding the metal foil layer and the base layer so that the metal foil layer is on an inside relative to the base layer, and
a plurality of tape portions fixing the overlapping portion to the cylindrical portion at predetermined intervals,
wherein a first end of the metal foil layer is coterminous with a first end of the base layer,
wherein a second end of the metal foil layer is coterminous with a second end of the base layer,
wherein the overlapping portion is in a state of being brought down and arranged along the cylindrical portion
wherein the tape portions prevent the overlapping portion from opening with respect to the cylindrical portion,
wherein one group of tape portions in the plurality of tape portions are arranged at a position corresponding to a bend of the cylindrical portion,
wherein intervals between the tape portions of the one group located at the bend are smaller than intervals of other tape portions not associated with the bend, and
wherein the cylindrical portion is loosely fitted to one or a plurality of conductive paths such that a gap is formed between the cylindrical portion and said one or the plurality of conductive paths.

2. A wire harness comprising:
the shield member according to claim 1; and
said one or the plurality of conductive paths which are accommodated in the cylindrical portion of the shield member.

3. The wire harness according to claim 2, further comprising:
an exterior member provided at an outside of the shield member, or wherein the base layer of the shield member also functions as the exterior member.

4. The shield member according to claim 1, further comprising:
a plated layer tinned to the metal foil layer, having a thickness of about 0.8 μm, and disposed more inwardly than the metal foil layer.

5. The shield member according to claim 1, further comprising a second base layer overlapping and adhesively bonded to the base layer.

6. A method of manufacturing a wire harness comprising:
  winding and folding a sheet-like member or a band-like member which is flexible and includes a metal foil layer, a base layer, and a bonding layer that bonds the metal foil layer and the base layer around one or a plurality of conductive paths so that the metal foil layer is on an inside relative to the base layer such that a first end of the metal foil layer is coterminous with a first end of the base layer, and a second end of the metal foil layer is coterminous with a second end of the base layer; and
  among a cylindrical portion and an overlapping portion which are made by the winding and folding, bringing down the overlapping portion so as to be arranged along the cylindrical portion and fixing the overlapping portion to the cylindrical portion at predetermined intervals by a plurality of tape portions, wherein
  the tape portions prevent the state that the overlapping portion from opening with respect to the cylindrical portion,
  one group of tape portions in the plurality of tape portions are arranged at a position corresponding to a bending point of the cylindrical portion,
  intervals between the tape portions of the one group located at the bend are smaller than intervals of the other tape portions not associated with the bend, and
  the cylindrical portion is loosely fitted to one or a plurality of conductive paths such that a gap is formed between the cylindrical portion and said one or the plurality of conductive paths.

* * * * *